US010629525B2

(12) United States Patent
Chebiam et al.

(10) Patent No.: US 10,629,525 B2
(45) Date of Patent: *Apr. 21, 2020

(54) SEAM HEALING OF METAL INTERCONNECTS

(71) Applicant: Intel Corporation, Santa Clara, CA (US)

(72) Inventors: Ramanan V. Chebiam, Hillsboro, OR (US); Christopher J. Jezewski, Portland, OR (US); Tejaswi K. Indukuri, Portland, OR (US); James S. Clarke, Portland, OR (US); John J. Plombon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/046,870

(22) Filed: Jul. 26, 2018

(65) Prior Publication Data

US 2019/0088593 A1     Mar. 21, 2019

Related U.S. Application Data

(63) Continuation of application No. 15/126,575, filed as application No. PCT/US2014/042572 on Jun. 16, 2014, now Pat. No. 10,068,845.

(51) Int. Cl.
*H01L 23/522* (2006.01)
*H01L 21/768* (2006.01)
(Continued)

(52) U.S. Cl.
CPC ........ *H01L 23/5226* (2013.01); *H01L 21/321* (2013.01); *H01L 21/76807* (2013.01);
(Continued)

(58) Field of Classification Search
CPC ......... H01L 21/76882; H01L 21/76838; H01L 23/53257; H01L 23/5226; H01L 23/53209
See application file for complete search history.

(56) References Cited

U.S. PATENT DOCUMENTS

| 5,731,245 A | 3/1998 | Joshi et al. |
| 6,399,486 B1 * | 6/2002 | Chen .................. H01L 21/2885 257/E21.175 |

(Continued)

FOREIGN PATENT DOCUMENTS

| JP | 2015519725 A | 7/2015 |
| JP | 2015534728 A | 12/2015 |

(Continued)

OTHER PUBLICATIONS

International Search Report and Written Opinion dated Jan. 30, 2015, issued in International Application No. PCT/PCT/US2014/042572, 11 pages.

(Continued)

*Primary Examiner* — Feifei Yeung Lopez
(74) *Attorney, Agent, or Firm* — Schwabe, Williamson & Wyatt, P.C.

(57) ABSTRACT

Embodiments of the present disclosure describe removing seams and voids in metal interconnects and associated techniques and configurations. In one embodiment, a method includes conformally depositing a metal into a recess disposed in a dielectric material to form an interconnect, wherein conformally depositing the metal creates a seam or void in the deposited metal within or directly adjacent to the recess and heating the metal in the presence of a reactive gas to remove the seam or void, wherein the metal has a melting point that is greater than a melting point of copper. Other embodiments may be described and/or claimed.

17 Claims, 4 Drawing Sheets

(51) Int. Cl.
*H01L 21/321* (2006.01)
*H01L 23/532* (2006.01)

(52) U.S. Cl.
CPC .. *H01L 21/76838* (2013.01); *H01L 21/76882* (2013.01); *H01L 21/76883* (2013.01); *H01L 23/53209* (2013.01); *H01L 23/53242* (2013.01); *H01L 23/53257* (2013.01); *H01L 2924/0002* (2013.01)

(56) References Cited

U.S. PATENT DOCUMENTS

| | | | |
|---|---|---|---|
| 10,068,845 B2* | 9/2018 | Chebiam | H01L 21/76807 |
| 2002/0008034 A1* | 1/2002 | Chen | C25D 3/38 205/82 |
| 2003/0129832 A1* | 7/2003 | Fujikawa | H01L 21/2855 438/660 |
| 2003/0206235 A1* | 11/2003 | Suzuki | H04N 5/2352 348/304 |
| 2005/0227479 A1 | 10/2005 | Feng et al. | |
| 2008/0064205 A1 | 3/2008 | Dominguez et al. | |
| 2008/0132050 A1 | 6/2008 | Lavoie | |
| 2012/0153483 A1* | 6/2012 | Akolkar | H01L 23/53247 257/758 |
| 2013/0260555 A1* | 10/2013 | Zope | H01L 21/4846 438/660 |
| 2015/0179579 A1* | 6/2015 | Jezewski | H01L 21/76846 257/753 |

FOREIGN PATENT DOCUMENTS

| | | |
|---|---|---|
| KR | 10-0177537 B1 | 4/1999 |
| WO | WO2014070586 A1 | 5/2014 |

OTHER PUBLICATIONS

Taiwan Office Action and Search Report dated Jun. 3, 2016, issued in corresponding Taiwan Patent Application No. 104114584.
Decision of Rejection in Primary Examination dated Nov. 30, 2016, issued in corresponding Taiwan Patent Application No. 104114584, 14 pages.
International Preliminary Report on Patentability dated Dec. 29, 2016, issued in corresponding International Application No. PCT/US2014/042572, 8 pages.
Office Action dated Oct. 25, 2017, issued in corresponding Taiwan Patent Application No. 104114584, 16 pages.
Office Action dated Apr. 3, 2018, issued in corresponding Japanese Patent Application No. 2016-567574, 8 pages.
Office Action dated Jul. 7, 2017 for U.S. Appl. No. 15/126,575, 18 pages.
Final Office Action dated Nov. 30, 2017 for U.S. Appl. No. 15/126,575, 9 pages.

* cited by examiner

SEAM HEALING OF METAL INTERCONNECTS

CROSS-REFERENCE TO RELATED APPLICATION

The present application is a continuation of U.S. application Ser. No. 15/126,575, filed Sep. 15, 2016, entitled "SEAM HEALING OF METAL INTERCONNECTS: which is a national phase entry under 35 U.S.C. § 371 of International Application No. PCT/US2014/042572, filed Jun. 16, 2014, entitled "SEAM HEALING OF METAL INTERCONNECTS," which designates the United States of America. The Specifications of PCT/US2014/042572 and U.S. Ser. No. 15/126,575 Applications are hereby fully incorporated by reference.

FIELD

Embodiments of the present disclosure generally relate to the field of integrated circuits, and more particularly, to removing seams and voids in metal interconnects and associated techniques and configurations.

BACKGROUND

Currently, interconnect structures for integrated circuit (IC) devices may be generally composed of copper. Non-copper metals are being investigated as a replacement material for emerging interconnect structures in order to provide interconnects having improved electrical characteristics such as, for example, improved resistance and/or electromigration relative to copper systems. Deposition of an interconnect metal using a conformal process may result in seams and/or voids being formed in the final interconnect structure. For copper interconnects, the seams and/or voids may be avoided using a bottom-up fill technique such as, for example, electroplating with additives to enable seam and void-free interconnects and reduce the resistance of the resulting copper interconnects by maximizing conducting volume. However, for metals having a higher melting point than copper, electroplating from an aqueous electrolyte may be difficult because the voltage required to deposit such metals may be above a breakdown voltage of the electrolyte and/or suitable additives may not be available. Other techniques to remove seams and/or voids for non-copper interconnect metals may hence be desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
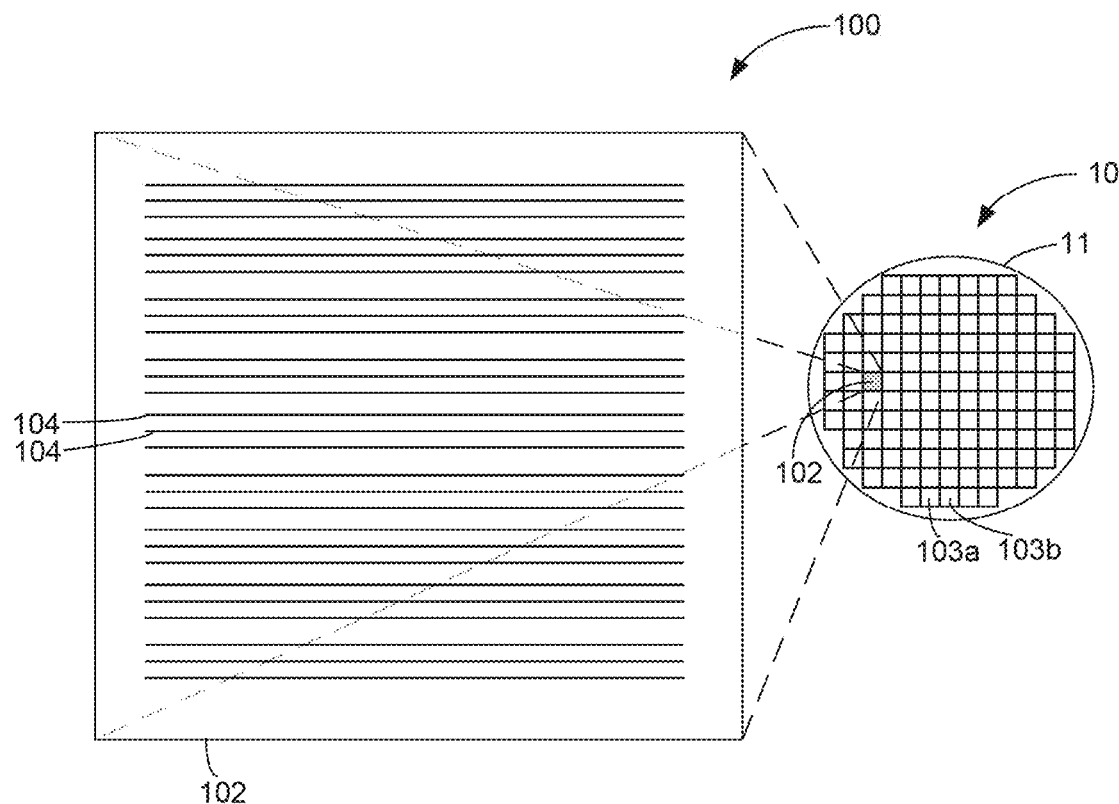
FIG. 1 schematically illustrates a top view of an example die in wafer form and in singulated form, in accordance with some embodiments.

Embodiments of the present disclosure describe removing seams and voids in metal interconnects and associated techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103*a*, 103*b*) of a wafer 11 composed of semiconductor material such as, for example, silicon or other suitable material. The plurality of dies may be formed on a surface of the wafer 11. Each of the dies may be a repeating unit of a semiconductor product that includes an interconnect assembly (e.g., interconnect assembly 300 of FIGS. 3*a-b*) as described herein. For example, the die 102 may include circuitry having transistor elements such as, for example, one or more channel bodies (e.g., fin structures, nanowires, planar bodies, etc.) that provide a channel pathway for mobile charge carriers of one or more transistor devices. Interconnects 104 may be formed on and coupled with the one or more transistor devices. For example, the interconnects 104 may be electrically coupled with a channel body to provide a gate electrode for delivery of a threshold voltage and/or a source/drain current to provide the mobile charge carriers for operation of a transistor device. Although the interconnects 104 are depicted in rows that traverse a substantial portion of the die 102 in FIG. 1 for the sake of simplicity, it is to be understood that the interconnects 104 may be configured in any of a wide variety of other suitable arrangements on the die 102 in other embodiments, including vertical and horizontal directions.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the interconnects 104 may be disposed on a semiconductor substrate in wafer form 10 or singulated form 100. The interconnects 104 described herein may be incorporated in a die 102 for logic or memory, or combinations thereof. In some embodiments, the interconnects 104 may be part of a system-on-chip (SoC) assembly.

Figure 2:
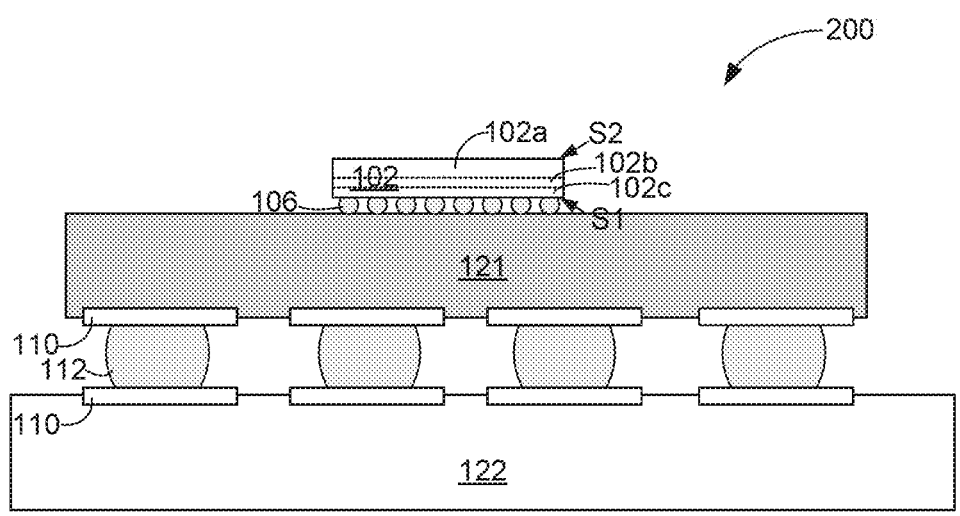
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102*a*, one or more device layers (hereinafter "device layer 102*b*") and one or more interconnect layers (hereinafter "interconnect layer 102*c*"). The semiconductor substrate 102*a* may be substantially composed of a bulk semiconductor material such as, for example silicon, in some embodiments. The device layer 102*b* may represent a region where active devices such as transistor devices are formed on the semiconductor substrate. The device layer 102*b* may include, for example, structures such as channel bodies and/or source/drain regions of transistor devices. The interconnect layer 102*c* may include interconnect structures (e.g., interconnects 104 of FIG. 4 or interconnect assembly 300 of FIGS. 3*a-b*) that are configured to route electrical signals to or from the active devices in the device layer 102*b*. For example, the interconnect layer 102*c* may include trenches and/or vias to provide electrical routing and/or contacts.

In some embodiments, the die-level interconnect structures 106 may be electrically coupled with the interconnect layer 102*c* and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 502 of FIG. 5).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
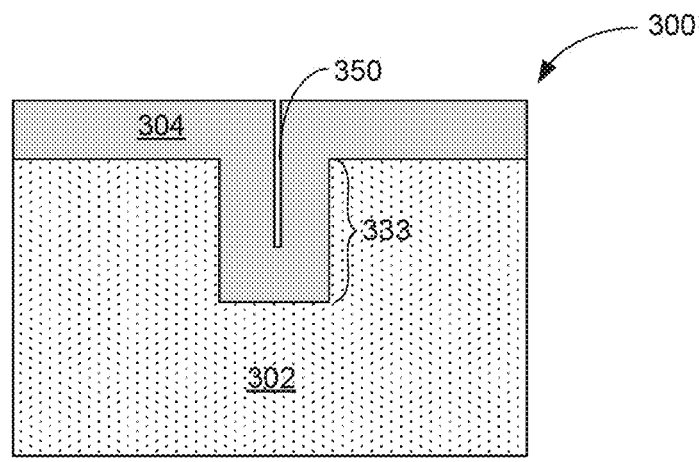
FIGS. 3a-b schematically illustrate a cross-section side view of an interconnect assembly during various stages of fabrication, in accordance with some embodiments.
Figure 3B:
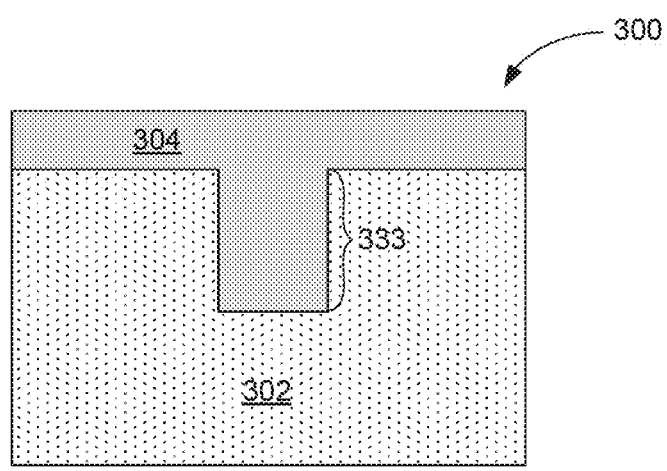

FIGS. 3a-b schematically illustrate a cross-section side view of an interconnect assembly 300 during various stages of fabrication, in accordance with some embodiments. The interconnect assembly 300 may comport with embodiments described in connection with interconnects 104 of FIG. 1 and vice versa. For example, dielectric material 302 may be part of an interconnect layer 102c disposed on a semiconductor substrate 102a of FIG. 2 in some embodiments.

Referring to FIG. 3a, an interconnect assembly 300 is depicted subsequent to forming a recess 333 in a dielectric material 302 (e.g., dielectric layer) and depositing a metal 304 into the recess 333 to form an interconnect using a conformal deposition process. The dielectric material 302 may represent a wide variety of electrically insulative materials including, for example, silicon oxide, silicon nitride, carbon-doped oxide and the like. The dielectric material 302 may represent a dielectric layer of a stack of dielectric layers that provide interconnect layers of a die, in some embodiments. For example, the dielectric material 302 may be part of interconnect layer 102c of the die 102 in FIG. 2, in some embodiments.

The recess 333 may be formed in the dielectric material 302 using any suitable technique including, for example, patterning processes such as etch and/or lithography processes. In some embodiments, when filled with metal 304, the recess 333 may represent a trench or via interconnect structure. In some embodiments, a portion of the metal 304 in the recess 333 may represent a via structure and a portion of the metal 304 over the recess 333 may represent a trench structure. In an embodiment where such via structure and trench structure are simultaneously formed using a single metal deposition process, the interconnect assembly 300 may represent a dual-damascene structure formed by a dual-damascene process. Although not shown, an interconnect structure formed by depositing the metal 304 may be further coupled with other similarly configured interconnect structures above or below the depicted interconnect assembly 300 to provide vertical and/or horizontal routing of electrical signals of a die.

In some embodiments, the metal 304 may be a non-copper metal having a melting point that is greater than a melting point of copper (e.g., greater than 1085° C.). For example, in some embodiments, the metal 304 may be composed of ruthenium (Ru), molybdenum (Mo), tungsten (W) and/or cobalt (Co), equivalents, or combinations thereof. In some embodiments, the metal 304 may be composed of rhenium (Re), iron (Fe), osmium (Os), rhodium (Rh), iridium (Ir), nickel (Ni), palladium (Pd), platinum (Pt), titanium (Ti), zirconium (Zr), hafnium (Hf), vanadium (V), niobium (Nb), tantalum (Ta), chromium (Cr) and/or technetium (Tc), equivalents, or combinations thereof. The metal may include non-metallic impurities such as, for example, carbon (C), hydrogen (H), oxygen (O), or nitrogen (N), at low atomic percentage (e.g., typically less than about 5% by atomic percentage). The metal 304 may be deposited using a conformal process where the deposited metal grows on exposed surfaces in a direction away from the exposed surface. For example, in some embodiments, the conformal deposition may be carried out by physical vapor deposition (PVD), chemical vapor deposition (CVD) and/or atomic layer deposition (ALD). The conformal deposition may also be carried out according to other techniques in other embodiments, such as, for example, electroless deposition. In some embodiments, other non-conformal deposition techniques (e.g., electroplating with additives) may result in formation of void-type defects that may be mitigated or repaired using techniques described herein.

In some embodiments, the conformal deposition of the metal 304 may result in a seam or void 350 being created in the deposited metal within or directly adjacent to the recess 333, as can be seen. A seam may be an interface where the deposited metal 304 on opposing surfaces comes together and a void 350 may be a gap between the deposited metal 304 from opposing surfaces. The seam or void 350 may adversely affect electrical and reliability performance of an interconnect formed by the metal 304. For example, the seam or void 350 may increase resistance of the interconnect. The presence of a seam or void 350 could also induce defects in processing of a subsequent layer on the seam or void 350. The seam or void 350 may have other shapes or configurations than depicted in other embodiments.

Referring to FIG. 3b, an interconnect assembly 300 is depicted subsequent to heating the metal 304 in the presence of a reactive gas to heal (e.g., remove) the seam or void. Such heating process may be an anneal process in some embodiments. Heating the metal 304 in the presence of a reactive gas may cause rearrangement of metal atoms at or near the surface and drive out vacancies such as seams or voids from the metal 304 to provide an interconnect where a seam or void is substantially reduced or completely removed from the interconnect.

In some embodiments, the metal 304 may be exposed to an elevated temperature for a period of time in the presence of a reactive gas. For example, in some embodiments, the metal 304 may be exposed to a temperature ranging from 300° C. to 800° C. for a time period ranging from 5 minutes to a couple of hours, under atmospheric pressure (~1 atm), in the presence of forming gas comprising hydrogen (e.g., less than 5% by volume). Other suitable temperature, time, pressure conditions and/or reactive gases may be used in other embodiments.

Removal of seams or voids as described herein may provide interconnect structures having improved reliability and resistance. In some embodiments, a vacancy concentration of the metal 304 may be less than a vacancy concentration of a same metal that has not been subjected to a process to remove seams or voids, as measured by Doppler Broadening Spectroscopy (DBS). For example, DBS may be used to measure vacancy concentration by monitoring positron diffusion lengths and/or positron lifetimes. Subsequent to anneal, vacancy concentration may approach single crystal vacancy concentration for that metal. In one embodiment, an "s" parameter indicative of Doppler broadening may have a value of about 0.4235 for a single crystal copper. Subsequent to deposition and prior to anneal in the presence of reactive gas, copper deposited by PVD may have an "s" value of about 0.44. Subsequent to thermal treatment as described herein to remove seams or voids, the "s" value of the copper deposited by PVD may approach 0.4235.

In some embodiments, the metal 304 may include a concentration of material from the reactive gas. In some embodiments, the metal 304 may have a concentration of the reactive gas and/or byproducts that is higher than a metal that is not thermally treated in the presence of a reactive gas as described herein. For example, in some embodiments, the metal 304 may have a concentration of hydrogen, carbon, oxygen and/or nitrogen atoms that is greater than a metal that is not thermally treated in the presence of a reactive gas as described herein. The concentration of hydrogen, carbon, oxygen and/or nitrogen may be less than 5% by atomic weight. In one embodiment, a concentration of hydrogen may change from about 8E21 atoms/cm$^3$ pre-anneal to 1E21 atoms/cm$^3$ post-anneal. The concentration of hydrogen atom may be measured, for example, by Secondary Ion Mass Spectrometry (SIMS), Rutherford Backscattering Spectrometry (RBS), or other suitable technique pre-anneal or post-anneal.

Figure 4:
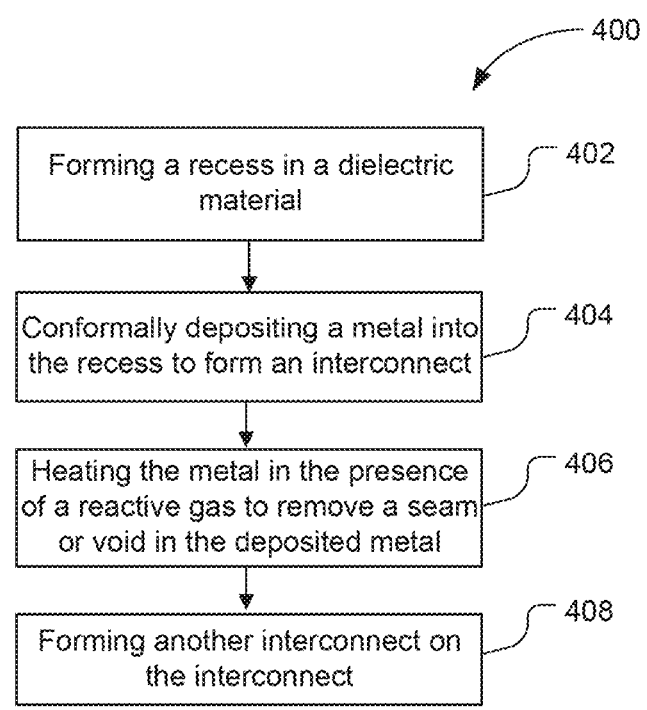
FIG. 4 schematically illustrates a flow diagram for a method of fabricating an interconnect assembly, in accordance with some embodiments.

FIG. 4 schematically illustrates a flow diagram for a method 400 of fabricating an interconnect assembly (e.g., interconnect assembly 300 of FIGS. 3a-b), in accordance with some embodiments. The method 400 may comport with embodiments described in connection with FIGS. 3a-b and vice versa.

At 402, the method 400 may include forming a recess (e.g., recess 333 of FIG. 3a) in a dielectric material (e.g., dielectric material 302 of FIG. 3a). The recess may be formed, for example, using a patterning process such as lithography and/or etch, or any other suitable technique. In some embodiments, the dielectric material may be part of an interconnect layer (e.g., interconnect layer 102c of FIG. 2) on a die (e.g., die 102 of FIG. 2).

At 404, the method 400 may include conformally depositing a metal (e.g., metal 304 of FIG. 3a) into the recess to form an interconnect. The metal may have a higher melting point than copper to provide an interconnect with improved electrical characteristics relative to copper for emerging interconnects having smaller dimensions than with copper. For example, in some embodiments, the metal may have improved electromigration characteristics relative to copper (e.g., Ru, Mo, W, Co, Re, Fe, Os, Rh, Ir, Ni, Pd, Pt, Ti, Zr, Hf, V, Nb, Ta, Cr, Tc and the like). The metal may include compounds or alloys or multiple layers of different metals in some embodiments. The conformal deposition may be performed according to a wide variety of suitable techniques including, for example, PVD and/or CVD, in some embodiments. In other embodiments, the metal may be conformally deposited using other suitable techniques. The conformal deposition may be part of a dual-damascene process, in some embodiments. In some embodiments, the conformal depositing may create a seam or void (e.g., seam or void 350 of FIG. 3a) in the deposited metal within or directly adjacent to the recess.

At 406, the method 400 may include heating the metal in the presence of a reactive gas to remove a seam or void in the deposited metal (e.g., metal 304 of FIG. 3b). In some embodiments, heating the metal may include an anneal process in the presence of forming gas comprising hydrogen. For example, in some embodiments, the metal 304 may be exposed to a temperature ranging from 300° C. to 800° C. for a time period ranging from 5 minutes to a couple of hours minutes, under atmospheric pressure (~1 atm), in the presence of forming gas comprising hydrogen (e.g., less than 5% by volume). Other suitable temperature, time, pressure conditions and/or reactive gases may be used in other embodiments. For example, the pressure may range from 1 atm to 10 atm or the hydrogen concentration may be greater than 5% by volume in some embodiments.

At 408, the method 400 may include forming another interconnect on the interconnect formed at 404. For example, additional dielectric material may be deposited on the interconnect and actions at 402 through 406 may be repeated to form the other interconnect. Such actions may be iteratively performed to provide substantially void-free interconnects of an interconnect layer of a die.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 5:
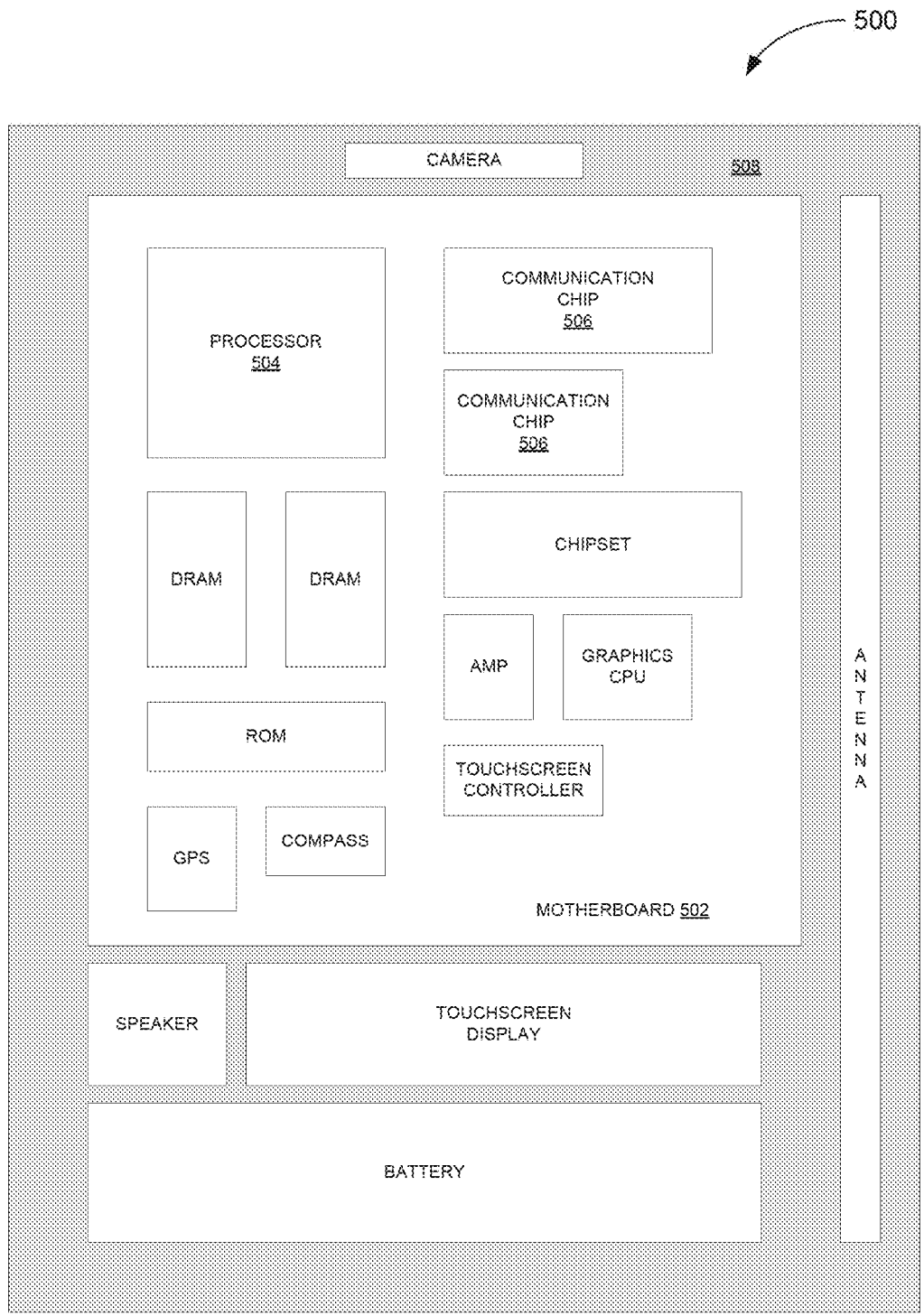
FIG. 5 schematically illustrates an example system that may include an interconnect assembly as described herein, in accordance with some embodiments.

FIG. 5 schematically illustrates an example system (e.g., computing device 500) that may include an interconnect assembly (e.g., interconnect assembly 300 of FIG. 3b) as described herein, in accordance with some embodiments. Components of the computing device 500 may be housed in an enclosure (e.g., housing 508). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

The processor 504 of the computing device 500 may include a die (e.g., die 102 of FIGS. 1-2) having an interconnect assembly (e.g., interconnect assembly 300 of FIG. 3b) as described herein. For example, the die 102 of FIGS. 1-2 may be mounted in a package assembly that is mounted on a circuit board such as the motherboard 502. The term "processor" may refer to any device or portion of a device that processes electronic data from registers and/or memory to transform that electronic data into other electronic data that may be stored in registers and/or memory.

The communication chip 506 may also include a die (e.g., die 102 of FIGS. 1-2) having an interconnect assembly (e.g., interconnect assembly 300 of FIG. 3b) as described herein. In further implementations, another component (e.g., memory device or other integrated circuit device) housed within the computing device 500 may contain a die (e.g., die 102 of FIGS. 1-2) having an interconnect assembly (e.g., interconnect assembly 300 of FIG. 3b) as described herein.

In various implementations, the computing device 500 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes a method. Example 1 of a method may include conformally depositing a metal into a recess disposed in a dielectric material to form an interconnect, wherein conformally depositing the metal creates a seam or void in the deposited metal within or directly adjacent to the recess and heating the metal in the presence of a reactive gas to remove the seam or void, wherein the metal has a melting point that is greater than a melting point of copper. Example 2 may include the method of Example 1, wherein conformally depositing the metal comprises depositing a metal selected from the group consisting of ruthenium (Ru), molybdenum (Mo), tungsten (W), cobalt (Co), rhenium (Re), iron (Fe), osmium (Os), rhodium (Rh), iridium (Ir), nickel (Ni), palladium (Pd), platinum (Pt), titanium (Ti), zirconium (Zr), hafnium (Hf), vanadium (V), niobium (Nb), tantalum (Ta), chromium (Cr) and technetium (Tc). Example 3 may include the method of Example 1, wherein conformally depositing the metal is carried out by physical vapor deposition (PVD), chemical vapor deposition (CVD) or atomic layer deposition (ALD). Example 4 may include the method of Example 1, wherein heating the metal comprises an anneal process and the reactive gas comprises hydrogen. Example 5 may include the method of any of Examples 1-4, wherein heating the metal comprises exposing the metal to a temperature between 300° C. and 800° C. Example 6 may include the method of Example 5, wherein heating the metal is performed at atmospheric pressure or higher. Example 7 may include the method of any of Examples 1-4, further comprising forming the recess in the dielectric material. Example 8 may include the method of any of Examples 1-4, wherein conformally depositing the metal is part of a dual-damascene process. Example 9 may include a product formed according to the method of any of Examples 1-8.

According to various embodiments, the present disclosure describes an apparatus. Example 10 of an apparatus, may include a semiconductor substrate, a dielectric material disposed on the semiconductor substrate and an interconnect formed in a recess of the dielectric material by conformal deposition of a metal such that a seam or void within the metal is removed by heating of the metal in the presence of a reactive gas subsequent to the conformal deposition of the metal, wherein the metal has a melting point that is greater than a melting point of copper. Example 11 may include the apparatus of Example 10, wherein the metal is selected from the group consisting of ruthenium (Ru), molybdenum (Mo), tungsten (W) and cobalt (Co). Example 12 may include the apparatus of Example 10 or 11, wherein a vacancy concentration of the metal as measured by Doppler Broadening Spectroscopy (DBS) is less than a vacancy concentration of a same metal that includes a seam or void that is not removed by heating in the presence of a reactive gas. Example 13 may include the apparatus of Example 10 or 11, wherein the reactive gas comprises hydrogen and the metal includes hydrogen atoms from the reactive gas disposed in the metal. Example 14 may include the apparatus of Example 10 or 11, wherein the interconnect is a dual-damascene structure.

According to various embodiments, the present disclosure describes a computing device. Example 15 of a computing device may include a circuit board and a die coupled with the circuit board, the die including a semiconductor substrate, a dielectric material disposed on the semiconductor substrate, and an interconnect formed in a recess of the dielectric material by conformal deposition of a metal such that a seam or void within the metal is removed by heating of the metal in the presence of a reactive gas subsequent to the conformal deposition of the metal, wherein the metal has a melting point that is greater than a melting point of copper. Example 16 may include the computing device of Example 15, wherein the metal is selected from the group consisting of ruthenium (Ru), molybdenum (Mo), tungsten (W) and cobalt (Co). Example 17 may include the computing device of Example 15, wherein a vacancy concentration of the metal as measured by Doppler Broadening Spectroscopy (DBS) is less than a vacancy concentration of a same metal that includes a seam or void that is not removed by heating in the presence of a reactive gas. Example 18 may include the computing device of Example 15, wherein the reactive gas comprises hydrogen and the metal includes hydrogen atoms from the reactive gas disposed in the metal. Example 19 may include the computing device of any of Examples 15-18, wherein the interconnect is a dual-damascene structure. Example 20 may include the computing device of any of Examples 15-18, wherein the die is a processor and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) die comprising:
a substrate of a semiconductor;
a dielectric material on the substrate; and
an interconnect in a recess of the dielectric material, wherein the interconnect includes a metal and hydrogen in the metal, and wherein the metal has a higher melting point than copper.

2. The IC die of claim 1, wherein the interconnect includes hydrogen in a concentration of less than 5% by atomic weight.

3. The IC die of claim 2, wherein the concentration of hydrogen is greater than 8E21 atoms per cubic centimeter.

4. The IC die of claim 1, wherein the metal includes one or more of ruthenium (Ru), molybdenum (Mo), tungsten (W), or cobalt (Co).

5. The IC die of claim 1, wherein the metal includes one or more of ruthenium (Ru), molybdenum (Mo), tungsten (W), cobalt (Co), rhenium (Re), iron (Fe), osmium (Os), rhodium (Rh), iridium (Ir), nickel (Ni), palladium (Pd), platinum (Pt), titanium (Ti), zirconium (Zr), hafnium (Hf), vanadium (V), niobium (Nb), tantalum (Ta), chromium (Cr), or technetium (Tc).

6. The IC die of claim 1, wherein the interconnect is a dual-damascene structure.

7. The IC die of claim 1, wherein the interconnect is formed by heating of the metal in the presence of a reactive gas that includes hydrogen.

8. A computing device comprising:
a circuit board; and
a die coupled with the circuit board, the die including:
a substrate of a semiconductor,
a dielectric material on the substrate, and
an interconnect in a recess of the dielectric material, wherein the interconnect includes a metal and hydrogen in the metal, and wherein the metal has a higher melting point than copper.

9. The computing device of claim 8, wherein the interconnect includes hydrogen in a concentration of less than 5% by atomic weight.

10. The computing device of claim 9, wherein the concentration of hydrogen is greater than 8E21 atoms per cubic centimeter.

11. The computing device of claim 8, wherein the metal includes one or more of ruthenium (Ru), molybdenum (Mo), tungsten (W), or cobalt (Co).

12. The computing device of claim 8, wherein the interconnect is a dual-damascene structure.

13. The computing device of claim 8, wherein the interconnect is formed by heating of the metal in the presence of a reactive gas that includes hydrogen.

14. The computing device of claim 8, wherein:
the die is a processor; and
the computing device further includes one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera.

15. A method comprising:
conformally depositing a metal into a recess in a dielectric material to form an interconnect, wherein conformally depositing the metal creates a seam or void in the deposited metal within or adjacent to the recess, wherein conformally depositing the metal comprises depositing at least one of ruthenium (Ru), molybdenum (Mo), tungsten (W), cobalt (Co), rhenium (Re), iron (Fe), osmium (Os), rhodium (Rh), iridium (Ir), nickel (Ni), palladium (Pd), platinum (Pt), titanium (Ti), zirconium (Zr), hafnium (Hf), vanadium (V), niobium (Nb), tantalum (Ta), chromium (Cr) or technetium (Tc); and
heating the metal in the presence of a reactive gas to remove the seam or void, wherein the reactive gas includes hydrogen.

16. The method of claim 15, wherein heating the metal comprises exposing the metal to a temperature between 300° C. and 800° C.

17. The method of claim 16, wherein heating the metal is performed at atmospheric pressure or higher.

* * * * *